United States Patent [19]

Ruth, Jr.

[11] Patent Number: 4,845,385

[45] Date of Patent: Jul. 4, 1989

[54] BICMOS LOGIC CIRCUITS WITH REDUCED CROWBAR CURRENT

[75] Inventor: Robert N. Ruth, Jr., San Diego, Calif.

[73] Assignee: Silicon Connections Corporation, San Diego, Calif.

[21] Appl. No.: 209,433

[22] Filed: Jun. 21, 1988

[51] Int. Cl.⁴ .......................................... H03K 17/16
[52] U.S. Cl. .................................. 307/446; 307/443; 307/570
[58] Field of Search ............... 307/443, 446, 448, 451, 307/454, 570, 270

[56] References Cited

U.S. PATENT DOCUMENTS

| | | | |
|---|---|---|---|
| 4,103,188 | 7/1978 | Morton | 307/446 X |
| 4,356,416 | 10/1982 | Weischedel | 307/570 |
| 4,682,054 | 7/1987 | McLaughlin | 307/443 X |
| 4,746,817 | 5/1988 | Banker et al. | 307/446 |
| 4,791,320 | 12/1988 | Kawata et al. | 307/446 |
| 4,808,850 | 2/1989 | Masuda et al. | 307/446 |

OTHER PUBLICATIONS

"Applications of Hi–BiCMOS Technology", Hitachi Review, vol. 35 (1986), No. 5, pp. 225–230 (See FIG. 3 on p. 326).
"Fast, Low–Power Logic Away Unites CMOS and Bipolar" Electronic Design, Apr. 16, 1987.
"TI's BiCMOS Two Interface ICs Slash Standby Current" Electronic Products, Jun. 15, 1987, pp. 17–19.
"How Motorola Moved BIMOS up to ULSI Levels" Electronics, Jul. 10, 1986, pp. 67–70.
"Power-Cell Library Brings High Voltage to Semicustom IC's"/Electronic Design, Jun. 11, 1987, pp. 93–100.
"NEC's BiCMOS Arrays Shatter Record" Electronics, Aug. 6, 1987, pp. 82–83.

Primary Examiner—David Hudspeth
Attorney, Agent, or Firm—Baker, Maxham, Jester & Meador

[57] ABSTRACT

A pair of bipolar transistors are connected in totem-pole fashion to provide an emitter-collector output connection. A pair of complementary MOS field-effect transistors are connected in push-pull fashion for each receiving a common input signal on a gate thereof and for driving a base of a corresponding one of the bipolar transistors. Resistors are connected to the field-effect transistors for isolating the output connection and substantially eliminating crowbar current.

15 Claims, 3 Drawing Sheets

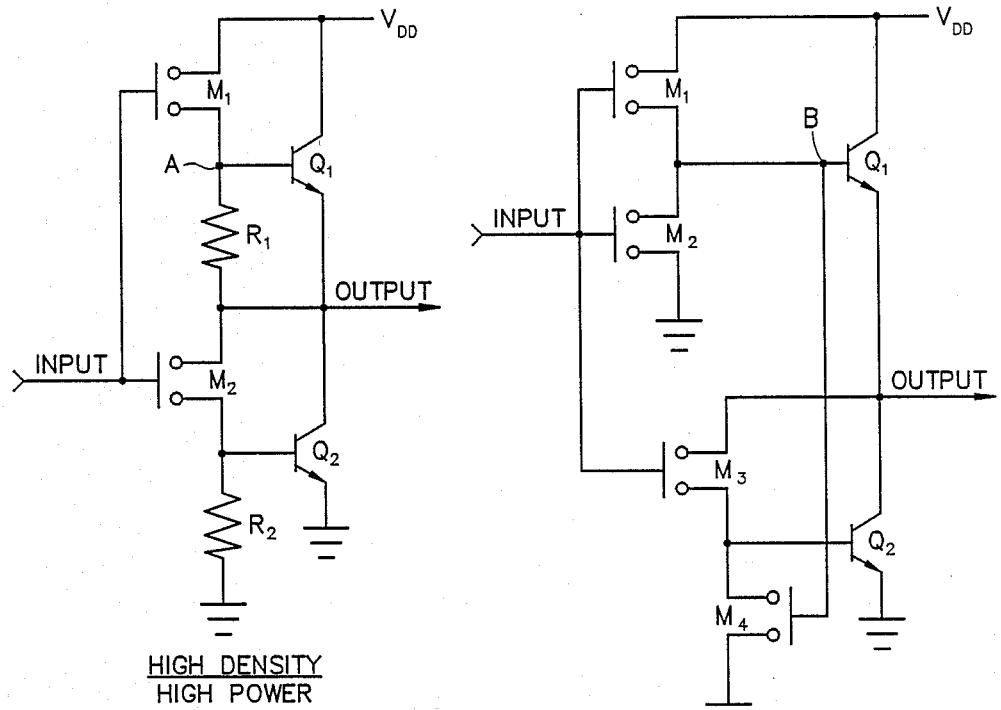
FIG. 1
PRIOR ART
HIGH DENSITY
HIGH POWER
FIG. 2
PRIOR ART
LOW DENSITY
LOW POWER
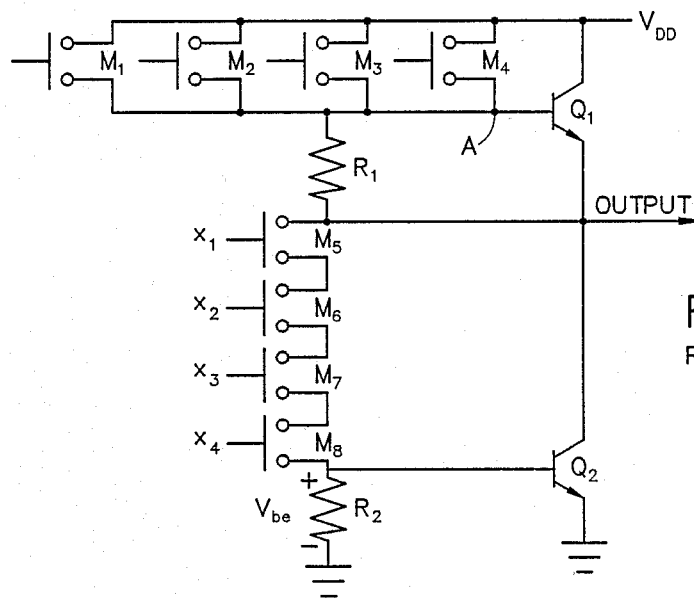
FIG. 3
PRIOR ART

BICMOS LOGIC CIRCUITS WITH REDUCED CROWBAR CURRENT

BACKGROUND OF THE INVENTION

The present invention relates to integrated circuits, and more particularly, to integrated circuits that combine bipolar and complementary metal-oxide semiconductor (CMOS) devices.

Two general types of digital logic circuits are bipolar transistor logic and metal-oxide-semiconductor (MOS) field-effect transistor (FET) logic. These two technologies each have unique performance characteristics which have been exploited in integrated circuits which until recently were fabricated exclusively with one approach or the other.

Originally logic circuits were fabricated based upon bipolar technology. This is because it was easier to fabricate a stable bipolar transistor than it was a MOSFET transistor in the early days of integrated circuit technology. Bipolar technology offers significant advantages in operating speed and current drive capability. MOS technology offers significant advantages in other performance areas such as functional density and power dissipation levels. Accordingly, in the early days of integrated circuit production, the bipolar approach was used for high speed and high current gates in small scale integration. Later on, the MOS approach was used to achieve relatively high functional density at very low power dissipation levels, e.g. very large scale integration (VLSI) subsystem and system functions on a single chip.

For a given type of logic family, the fabrication technology is extremely important in getting the highest performance levels possible. The principal bipolar logic families are the current mode logic (CML), which is also called emitter-coupled logic (ECL) and transistor-transistor logic (TTL). The principal MOS logic families are (1) the traditional MOS approach using exclusively p-channel or n-channel FETs to fabricate large memories and microprocessor VLSI circuits that operate at megahertz speeds (as compared with over 100 times that speed with bipolar logic); and (2) the CMOS technology using both p-channel and n-channel FETs to provide very low power digital logic functions at densities intermediate between that offered by the bipolar and traditional MOS approaches.

The MOSFET transistor can be used in various connections to perform an NAND or NOR operation. Other gates can be realized by using all p-channel devices or all n-channel devices. CMOS integrated circuits use both p-channel and n-channel FETs in a complementary push-pull arrangement. This complicates the fabrication process somewhat since both types of transistors must be fabricated on the same circuit. However, CMOS technology offer numerous significant advantages over traditional MOS technology. The transfer characteristics of a CMOS gate are superior. With CMOS logic the power supply voltage can vary significantly without disrupting proper gate operation. CMOS allows the designer to spread out the 0 and 1 levels to provide a larger noise margin and higher drive voltage levels. With a CMOS gate, one or the other path to ground from the power supply is open except at the exact middle of the transition region when both transistors are on. Therefore current flows from the power supply only during the brief time of transition from 0 to 1, resulting in very low power dissipation. Unfortunately, the very brief power supply current spike during transitions can be large and cause noise problems in the rest of the system.

Recently integrated circuits have become commercially available that utilize both the bipolar and CMOS approaches in the same chip in order to capitalize on the unique performance advantages of each technology. Such devices combine the short propagation delays of bipolar with low CMOS standby currents.

Previous work in the BiCMOS area has been directed to techniques where low power is achieved only with added complexity, i.e. low density, or high density is achieved at the expense of higher power resulting in undesirable crowbar current.

FIG. 1 of the drawings herein illustrates one prior art BiCMOS logic gate in the form of an inverter. A p-channel MOSFET $M_1$ and an n-channel MOSFET $M_2$ have their gates connected to a common input. The drain of MOSFET $M_1$ is connected through resistor $R_1$ to the drain of MOSFET $M_2$ whose source is grounded through resistor $R_2$. A pair of NPN bipolar transistors $Q_1$ and $Q_2$ have their bases connected to the drains of MOSFET $M_1$ and MOSFET $M_2$, respectively. The collector of transistor $Q_1$ is connected to voltage source $V_{DD}$. The source of MOSFET $M_1$ is also connected to voltage source $V_{DD}$. The emitter of transistor $Q_2$ is grounded. The emitter of transistor $Q_1$ is connected to the collector of transistor $Q_2$ and to resistor $R_1$ and the drain of MOSFET $M_2$ to provide an output. This BiCMOS gate has the advantage of high density since it only has four transistors, but it suffers from high power dissipation due to substantial crowbar current of bipolar transistors $Q_1$ and $Q_2$. This effect is caused by transistor $Q_2$ discharging node A through resistor $R_1$. This develops a voltage across the base-emitter junction of transistor $Q_1$, turning $Q_1$ ON at the same time as $Q_2$. This negative effect can be reduced by reducing the value of resistor $R_1$, but this in turn slows down transistor $Q_1$ from turning ON in the opposite case, i.e. transistor $Q_2$ OFF, output low to high). Also the value of resistor $R_2$ can be reduced to slow down the turning on of transistor $Q_2$. However, with both these techniques the output performance of the BiCMOS inverter is degraded. The problem becomes more severe as the logic function increases.

FIG. 3 illustrates a four-input NAND gate implemented in BiCMOS in accordance with the prior art approach exemplified in the BiCMOS inverter circuit of FIG. 1. In the circuit of FIG. 3, $M_1$, $M_2$, $M_3$ and $M_4$ are p-channel MOSFETs and $M_5$, $M_6$, $M_7$ and $M_8$ are n-channel MOSFETs. The series effect of MOSFETs $M_5$ through $M_8$ reduces the discharge rate of node A. As a voltage is developed across resistor $R_2$ of approximatel $V_{be}$, the bipolar transistor $Q_2$ turns ON and attempts to discharge node A, turning on bipolar transistor $Q_1$ and causing crowbar current to occur. Because of this negative effect, most attempts to develop BiCMOS logic circuitry have used the technique illustrated in the logic circuit illustrated in FIG. 2.

In the prior art BiCMOS circuit of FIG. 2, resistors $R_1$ and $R_2$ are eliminated, and a pair of n-channel MOSFETs $M_3$ and $M_4$ are connected as illustrated. The base of bipolar transistor $Q_1$ is connected to the drain connections of MOSFETs $M_1$ and $M_2$. The gate of MOSFET $M_3$ is connected to the common input signal and the gate of MOSFET $M_4$ is connected to the base of bipolar transistor $Q_1$. The drain of MOSFET $M_3$ is connected to the emittercollector output connection between bipolar transistors $Q_1$ and $Q_2$. The base of bipolar transistor $Q_2$ is connected to the source-drain connection of MOSFETs $M_3$ and $M_4$. The source of MOSFET $M_4$ and the emitter of bipolar transistor $Q_2$ are grounded. The approach of this prior art circuit has the advantage of eliminating the crowbar current effect of bipolar transistors $Q_1$ and $Q_2$. Not until node B is fully discharged will MOSFET $M_4$ turn OFF, allowing bipolar transistor $Q_2$ to turn ON. The disadvantage of this approach is that it results in relatively low density and/or low speed, as will be more fully appreciated by way of reference to FIG. 4.

FIG. 4 illustrates a four-input NAND gate implemented in BiCMOS in accordance with the prior art approach exemplified in the BiCMOS circuit of FIG. 2. $M_1$ through $M_4$ are p-channel MOSFETs. The four inseries n-channel MOSFETs $X_{1A}$ through $X_{4A}$ must be replicated in the form of another four in-series MOSFETs $X_{1B}$ through $X_{4B}$ in order for the logic to turn ON bipolar transistor $Q_2$. This also increases the input loading capacitance for this type of logic. Clearly, because of the many transistor required, the low density of this approach is undesirable.

Further details regarding prior approaches to BiCMOS technology may be found in the following articles: "Applications of Hi-BiCMOS Technology", Hitachi Review, Vol. 35 (1986), No. 5. pp 225–230 (See in particular FIG. 3 on page 226); "Fast, low-power logic array unites CMOS and bipolar", ELECTRONIC DESIGN, Apr. 16, 1987; "TI's BiCMOS bus interface ICs slash standby current", ELECTRONIC PRODUCTS, June 15, 1987, pp 17–19; "HOW MOTOROLA MOVED BIMOS UP TO VLSI LEVELS", Electronics, July 10, 1986, pp 67–70; "Power-cell library brings high voltage to semicustom ICs", Electronic Design, June 11, 1987, pp 93–100; and "NEC's BiCMOS ARRAYS SHATTER RECORD", Electronics, Aug. 6, 1987, pp 82–83.

SUMMARY OF THE INVENTION

It is the primary object of the present invention to provide a basis for a BiCMOS family of logic circuits with high capacitance drive capability, high density and low power dissipation.

It is another object of the present invention to provide a basic building block for high density, low power BiCMOS logic circuits that substantially eliminates crowbar current.

According to the present invention, higher density with low power in a BiCMOS logic integrated circuit is achieved by optimizing the performance of the bipolar transistors by eliminating any simultaneous ON conditions in the bipolar transistors to thereby substantially reduce crowbar current. The output node of the logic circuit is isolated from the internal driving node of the CMOS FETs, and internal switching nodes are optimized.

In an illustrated embodiment of the invention a pair of bipolar transistors are connected in totem-pole fashion to provide an emitter-collector output connection. A pair of complementary MOS field-effect transistors are connected in push-pull fashion for each receiving a common input signal on a gate thereof and for driving a base of a corresponding one of the bipolar transistors. Resistors are connected to the field-effect transistors for isolating the output connection and substantially eliminating crowbar current.

BRIEF DESCRIPTION OF THE DRAWINGS

FIG. 1 of the drawings herein illustrates one prior art BiCMOS logic gate in the form of an inverter.

FIG. 2 of the drawings herein illustrates an alternate prior art approach for building a BiCMOS logic gate.

FIG. 3 illustrates a four-input NAND gate implemented in BiCMOS in accordance with the prior art approach exemplified in the BiCMOS circuit of FIG. 1.

DESCRIPTION OF THE PREFERRED EMBODIMENTS

Figure 4:
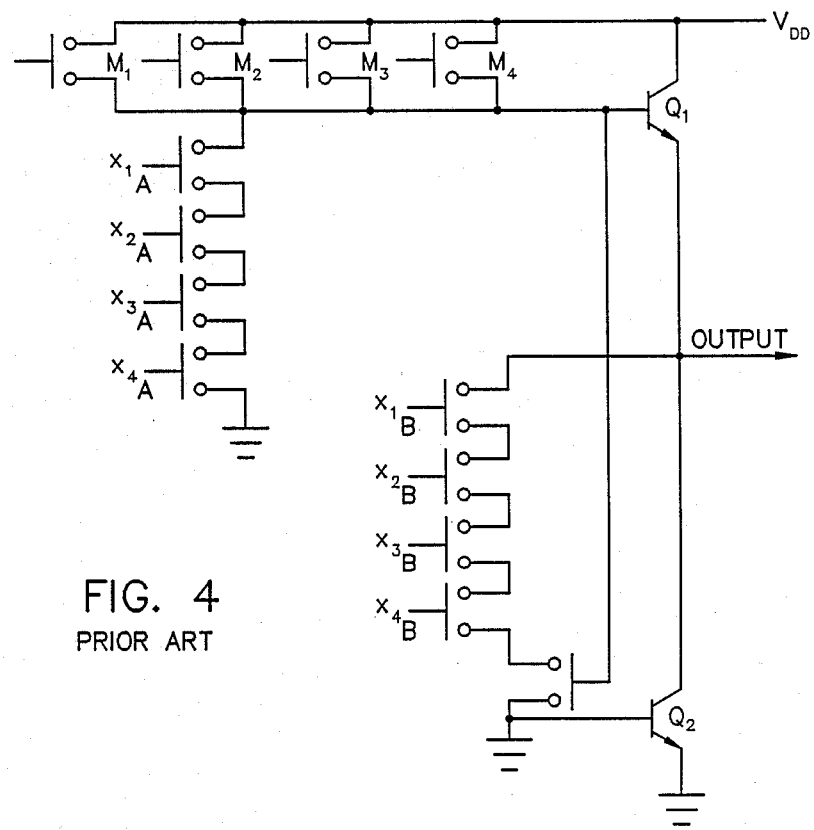
FIG. 4 illustrates a four-input NAND gate implemented in BiCMOS in accordance with the prior art approach exemplified in the BiCMOS circuit of FIG. 2.
Figure 5:
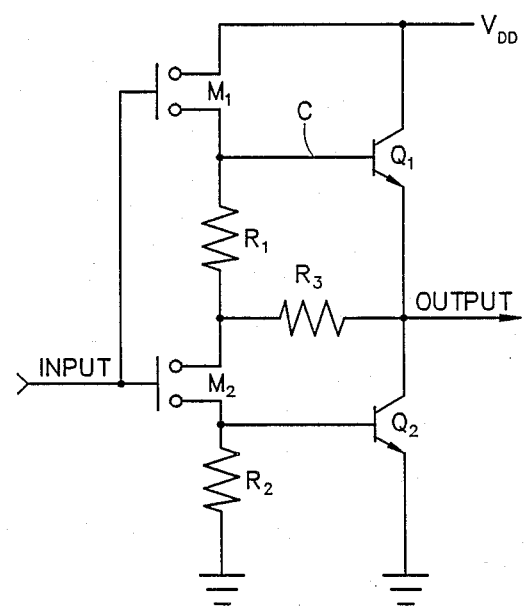
FIGS. 5–7 illustrate various BiCMOS logic circuits embodying my invention.

Referring to FIG. 5, a BiCMOS integrated circuit is fabricated with a p-channel MOSFET $M_1$ and an n-channel MOSFET $M_2$ connected in push-pull fashion. A gate of the MOSFET $M_1$ is connected to a gate of the MOSFET $M_2$ for receiving a common low or high digital input signal. A first resistor $R_1$ connects a drain of the MOSFET $M_1$ to a drain of the MOSFET $M_2$. A second resistor $R_2$ connects a source of the MOSFET $M_2$ to ground. A first NPN bipolar transistor $Q_1$ and a second NPN bipolar transistor $Q_2$ are connected in totem-pole fashion to provide an emitter-collector output connection. More specifically, the bipolar transistor $Q_1$ has its emitter connected to the collector of the bipolar transistor $Q_2$ at the node labeled OUTPUT in FIG. 5. The first bipolar transistor $Q_1$ further has its base connected to the drain of the MOSFET $M_1$ and its collector connected to the drain of the MOSFET $M_1$. The second bipolar transistor $Q_2$ has its base connected to the source of the MOSFET $M_2$, its collector connected to the emitter of the bipolar transistor $Q_1$, and its emitter connected to ground. A third resistor connects the drain of the MOSFET $M_2$ to the OUTPUT node, i.e. the connection of the emitter of the bipolar transistor $Q_1$ and the collector of the bipolar transistor $Q_2$.

In the circuit of FIG. 5, the resistance value of resistor $R_3$ is made sufficiently large relative to the resistance value of resistor $R_1$ to allow bipolar transistor $Q_1$ to turn ON rapidly while also allowing MOSFET $M_2$ to discharge a signal at the base of bipolar transistor $Q_1$ (node C) before bipolar transistor $Q_2$ turns ON to thereby substantially reduce crowbar current.

The circuit of FIG. 5 has the advantage of reduced transistor count (high density) while at the same time achieving low power dissipation through the addition of resistor $R_3$. The series combination of resistors $R_1$ and $R_3$ is made large in order to turn transistor $Q_1$ ON quickly in a low-to-high transition of output. However, the resistance of $R_1$ is sufficiently low with respect to the resistance of $R_3$ to allow MOSFET $M_2$ to discharge node C rapidly, before transistor $Q_2$ turns ON. The resistance of $R_3$ is relatively large in order to isolate the output of the logic circuit from the internal nodes thereof. For large, complex gates, the resistance values of $R_1$, $R_2$ and $R_3$ can be adjusted for optimum performance without increasing the active area of the chip while still achieving low power dissipation through the reduction of crowbar current.

Figure 6:
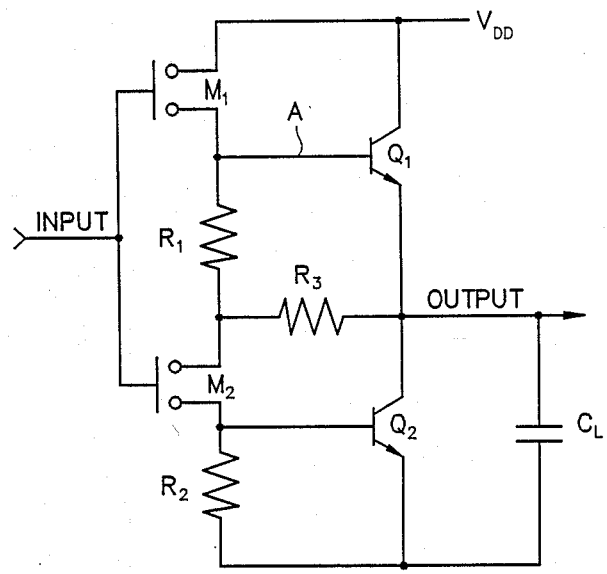

Referring to FIG. 6, for large capacitance loads $C_L$, node A discharges slowly, and transistor $Q_2$ turns ON and attempts to pull the output low. Resistor $R_3$ is added to isolate the output from node A allowing n- channel MOSFET $M_2$ to discharge node A first, otherwise transistor $Q_2$ will attempt to pull node A low, discharging through resistor $R_1$ and turning ON transistor $Q_1$ at the same time and thereby produce undesirable crowbar current. By way of example, the sum of the resistance values of $R_1$ and $R_3$ may approximate the resistance value of $R_2$. The value of $R_1$ is preferably substantially less that the value of $R_3$. By way of further example, $R_1$ may be 1.5K ohms, $R_2$ may be 5.0K ohms and $R_3$ may be 4.0 K ohms.

Figure 7:
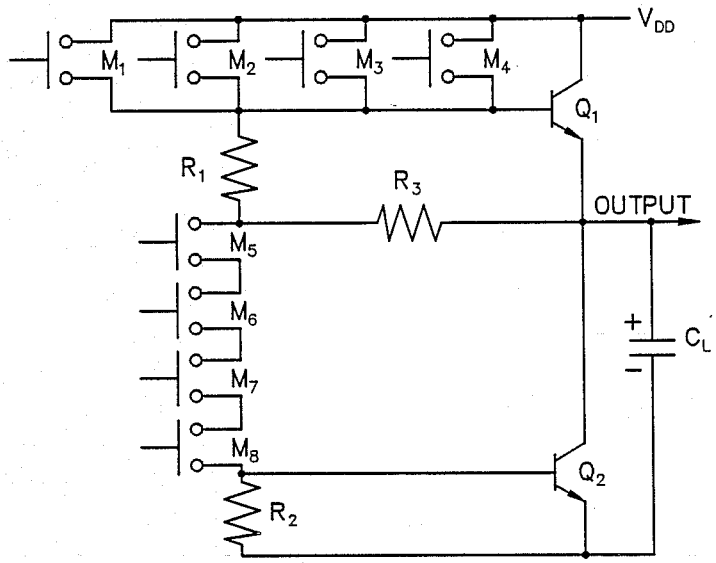

FIG. 7 illustrates a BiCMOS implementation of an NAND gate in accordance with my invention. Transistors $M_1$ through $M_4$ are p-channel MOSFETs. Transistors $M_5$ through $M_8$ are n-channel MOSFETs.

Having described BiCMOS logic circuits with reduced crowbar current, it will be apparent to those skilled in the art that my invention can be modified in both arrangement and detail. Therefore, the protection afforded by invention should only be limited in accordance with the scope of the following claims.

I claim:

1. A BiCMOS integrated logic circuit, comprising:
    a pair of bipolar transistors connected in totem-pole fashion to provide an emitter-collector output connection;
    a pair of complementary MOS field-effect transistors connected in push-pull fashion for each receiving a common input signal on a gate thereof and for driving a base of a corresponding one of the bipolar transistors; and
    resistor means connected to the field-effect transistors for isolating the output connection and substantially eliminating crowbar current.

2. A BiCMOS integrated logic circuit according to claim 1 wherein the bipolar transistors are both of the NPN type and an emitter of a first one of the bipolar transistors is connected to a collector of a second one of the bipolar transistors to form the emitter-collector output connection and an emitter of the second bipolar transistor is connected to a ground.

3. A BiCMOS integrated logic circuit according to claim 2 wherein a first one of the field-effect transistors is a p-channel MOSFET having a drain connected to a drain of a second one of the field-effect transistors which is an n-channel MOSFET.

4. A BiCMOS integrated logic circuit according to claim 3 wherein a source of the p-channel MOSFET is connected to a voltage source and a collector of the first bipolar transistor.

5. A BiCMOS integrated logic circuit according to claim 4 wherein the drain of the p-channel MOSFET is connected to a base of the first bipolar transistor.

6. A BiCMOS integrated logic circuit according to claim 5 wherein a source of the n-channel MOSFET is connected to a base of the second bipolar transistor.

7. A BiCMOS integrated logic circuit according to claim 6 wherein the resistor means includes a first resistor which connects the drain of the p-channel MOSFET to the drain of the n-channel MOSFET.

8. A BiCMOS integrated logic circuit according to claim 7 and further comprising a second resistor which connects the source of the n-channel MOSFET to the ground.

9. A BiCMOS integrated logic circuit according to claim 8 wherein the resistor means further includes a third resistor which connects the drain of the n-channel MOSFET to the emitter-collector output connection.

10. A BiCMOS integrated logic circuit according to claim 9 wherein a resistance value of the third resistor is sufficiently large relative to a resistance value of the first resistor to allow the first bipolar transistor to turn ON rapidly while also allowing the n-channel MOSFET to discharge a signal at the base of the first bipolar transistor before the second bipolar transistor turns ON to thereby substantially reduce crowbar current.

11. A BiCMOS integrated logic circuit according to claim 1 wherein the sum of the resistance values of the first and third resistors is substantially equal to a resistance value of the second resistor.

12. A BiCMOS integrated circuit, comprising:
    a p-channel MOSFET;
    an n-channel MOSFET;
    a gate of the p-channel MOSFET being connected to a gate of the n-channel MOSFET;
    a first resistor connecting a drain of the p-channel MOSFET to a drain of the n-channel MOSFET;
    a second resistor connecting a source of the n-channel MOSFET to a ground;
    a first NPN bipolar transistor having a base connected to the drain of the p-channel MOSFET and a collector connected to a drain of the p-channel MOSFET;
    a second NPN bipolar transistor having a base connected to the source of the n-channel MOSFET, a collector connected to an emitter of the first NPN bipolar transistor, and an emitter connected to the ground;
    a third resistor connecting the drain of the n-channel MOSFET to the emitter of the first NPN bipolar transistor and the collector of the second NPN bipolar transistor; and
    a resistance value of the third resistor being sufficiently large relative to a resistance value of the first resistor to allow the first NPN bipolar transistor to turn ON rapidly while also allowing the n-channel MOSFET to discharge a signal at the base of the first NPN bipolar transistor before the second NPN bipolar transistor turns ON to thereby substantially reduce crowbar current.

13. A BiCMOS integrated logic circuit according to claim 12 wherein the sum of the resistance values of the first and third resistors is substantially equal to a resistance value of the second resistor.

14. A BiCMOS integrated logic circuit according to claim 12 wherein the resistance value of the first resistor is approximately one-third the resistance value of the third resistor.

15. A BiCMOS integrated logic circuit according to claim 12 and further comprising a plurality of p-channel MOSFETs connected in parallel and a plurality of n-channel MOSFETs connected in series to thereby configure the circuit in the form of an NAND gate.

* * * * *